(12) United States Patent
Bianco

(10) Patent No.: US 8,587,911 B2
(45) Date of Patent: Nov. 19, 2013

(54) SERVICE LINE SAFETY MONITOR

(75) Inventor: James S. Bianco, Suffield, CT (US)

(73) Assignee: Control Module, Inc., Enfield, CT (US)

( * ) Notice: Subject to any disclaimer, the term of this patent is extended or adjusted under 35 U.S.C. 154(b) by 15 days.

(21) Appl. No.: 13/470,574

(22) Filed: May 14, 2012

(65) Prior Publication Data

US 2012/0287542 A1 Nov. 15, 2012

Related U.S. Application Data

(60) Provisional application No. 61/485,257, filed on May 12, 2011.

(51) Int. Cl.
*H02H 3/18* (2006.01)
(52) U.S. Cl.
USPC .............................. 361/86; 361/79

(58) Field of Classification Search
USPC ................................ 361/78, 79, 86
See application file for complete search history.

(56) References Cited

U.S. PATENT DOCUMENTS

| 8,432,175 B2 * | 4/2013 | Hein ............................ 324/705 |
| 2011/0169447 A1 * | 7/2011 | Brown et al. ................. 320/109 |

* cited by examiner

*Primary Examiner* — Danny Nguyen
(74) *Attorney, Agent, or Firm* — Alix, Yale & Ristas, LLP

(57) ABSTRACT

A service line safety monitor which may be configured as a separate module or incorporated into an EVSE is adapted to monitor the connection with the service line to determine whether there is a defect in the connection. The module preferably employs a current transformer to determine a no-load and a load applied to the EVSE. Comparisons are made to determine whether there is a power loss. In the event of a power loss beyond a safe limit, the monitor disconnects the EVSE from the service line. A warning indicator is also employed.

11 Claims, 5 Drawing Sheets

SERVICE LINE SAFETY MONITOR

CROSS-REFERENCE TO RELATED APPLICATION

This application claims the priority of U.S. Provisional Patent Application No. 61/485,257 filed on May 12, 2011, the disclosure of which is incorporated by reference in its entirety.

BACKGROUND

New electric vehicles are typically supplied with a portable charging unit that allows the vehicle to be charged from a standard household electric outlet. The standard outlet typically is rated to supply 15 or 20 amps. The portable charging unit is commonly referred to as a portable EVSE (Electric Vehicle Service Equipment). The portable EVSE typically includes a handle and is adapted to provide for charging the battery of the electric vehicle at both the residence of the electric vehicle operator and at standard outlets remote from the residence.

The portability feature which allows and encourages the portable EVSE be plugged into a standard outlet also potentially presents significant risks. The integrity of the electrical connection at a standard outlet is extremely important for the charging of the electric vehicle since the battery charging commonly takes place over several hours. In some instances, a defective outlet could cause extreme heating and potentially lead to an electrical fire. The purpose of the present disclosure is to address the safety issues presented by defective standard outlets which are employed to supply power to EVSE.

When an electric vehicle is being charged it draws a very substantial current. Typically 80% of the outlet rating is drawn. For a 15 amp rating outlet current, 12 amps would be drawn. This high current load complies generally with all electrical codes. However, the rating is for electrical branch circuits with secure wire junctions of high electrical and mechanical integrity. Over time and through usage, an outlet rating is compromised, for example, by loose screws at the breaker or outlet, loose wires at the connection and worn outlet connectors. Such defective connections, which partially connect, and rarely do not completely not connect, to an appliance, cause a substantial voltage drop across the loose junction. The voltage drop multiplied by the current drawn through the junction results in a power dissipation which generates an elevated temperature at the junction.

For most conditions of usage of a standard outlet, using a household electrical appliance or device, such as, for example an electric drill, the voltage drop goes unnoticed and is rarely consequential because power is supplied intermittently and randomly. For short time periods, the generated heat from the loose wire junctions has ample time to dissipate.

The situation can be dramatically different when a portable EVSE is plugged into a standard outlet which has a loose wire, a loose circuit component and/or a loose connector at the outlet. This is because when the electric vehicle is charging, the current is continuously being drawn at a high level through the inlet over a long period of time. For some electric vehicles the charging may take place over 10-12 hours. Consequently, the power loss due to the defective electrical outlet and/or circuit will generate heat over an extended period of time. If heat is in the vicinity of easily ignitable material or flammable materials, a very dangerous situation will develop.

The use of auxiliary extension cords is also problematic. Each portable EVSE and/or electric vehicle is provided with a warning label or sheet indicating that the portable EVSE should not be used with an extension cord. Not all operators will pay attention to the warning label, and other individuals not knowledgeable of the extension cord advisory may be tempted to use an extension cord for convenience purposes. Extension cord connectors commonly wear and degrade. The usage of an extension cord introduces another structure where a substantial voltage drop could result in sufficient heat generated by the power loss to potentially cause a fire and represent a threat to property and personal safety.

SUMMARY

Briefly stated, a method for detecting a defective connection to an EVSE comprises applying a line power to the EVSE and determining whether the EVSE is drawing a load current. The line voltage is measured when there is no load current. The no-load voltage is stored in a memory. A current load is supplied to the EVSE. The EVSE load voltage is measured under a load. A voltage loss differential is determined from the load voltage and the no-load voltage. A power loss is derived from the voltage loss differential. A determination is made whether the power loss exceeds a safe limit. The EVSE load voltage is disconnected from the line voltage if the safe limit is exceeded. A warning signal is further displayed.

A current transformer is employed to determine the load current. The step of disconnecting the load current from line voltage further comprises a relay controlled line contact. The step of determining whether the power loss exceeds a safe limit further comprises storing safe limit data in the memory and comparing the power loss to the safe limit data.

A service line safety monitor comprises a connector for applying line power to an EVSE. A current transformer measures line voltage when there is no-load current drawn by the EVSE. An EVSE load voltage is measured while the EVSE draws a load current. A memory is employed to store the measured no-load line voltage. A microprocessor is programmed to determine the differential voltage between the no-load voltage and the load voltage measurement. A power loss due to the voltage differential is determined and a determination is made as to whether the exceeded power loss is within a safe limit. A line contact is opened to disconnect the EVSE from the line voltage if a safe limit has been exceeded.

The line contact is controlled by a relay. The memory further has safe limit data and the microprocessor accesses the safe limit data for determining whether the power loss exceeds a safe limit. The safety model, in one embodiment, is configured as a module interposed between the service line and an EVSE. In another embodiment, the monitor is integrated with the EVSE. An indicator displays a warning signal when the safe limit is exceeded.

DETAILED DESCRIPTION

With reference to the drawings wherein like numerals represent like parts throughout the several figures, a service line monitor designated generally by the numeral 10 may be a separate self-contained device 20 which is interposed between the EVSE and a standard outlet or may be incorporated into the EVSE itself.

Figure 3:
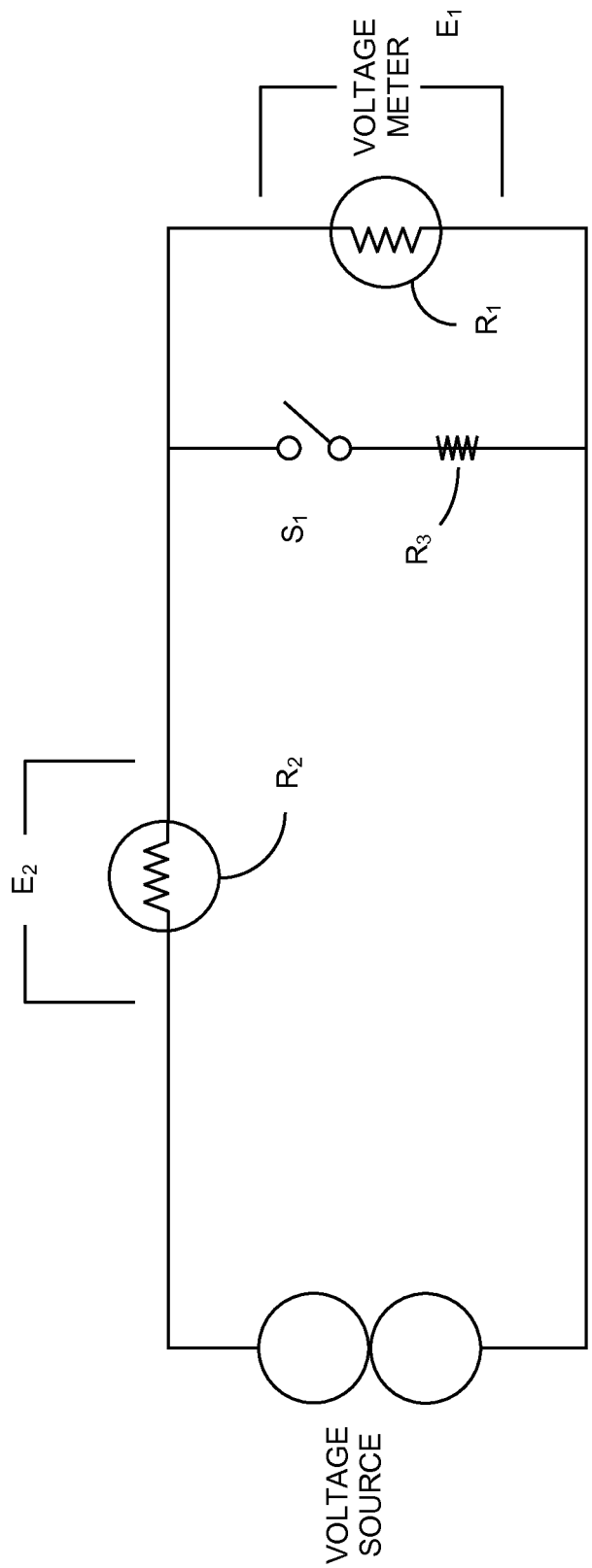
FIG. 3 is a representative circuit schematically illustrating a voltage drop across a defect and across a voltage meter.
Figure 4A:
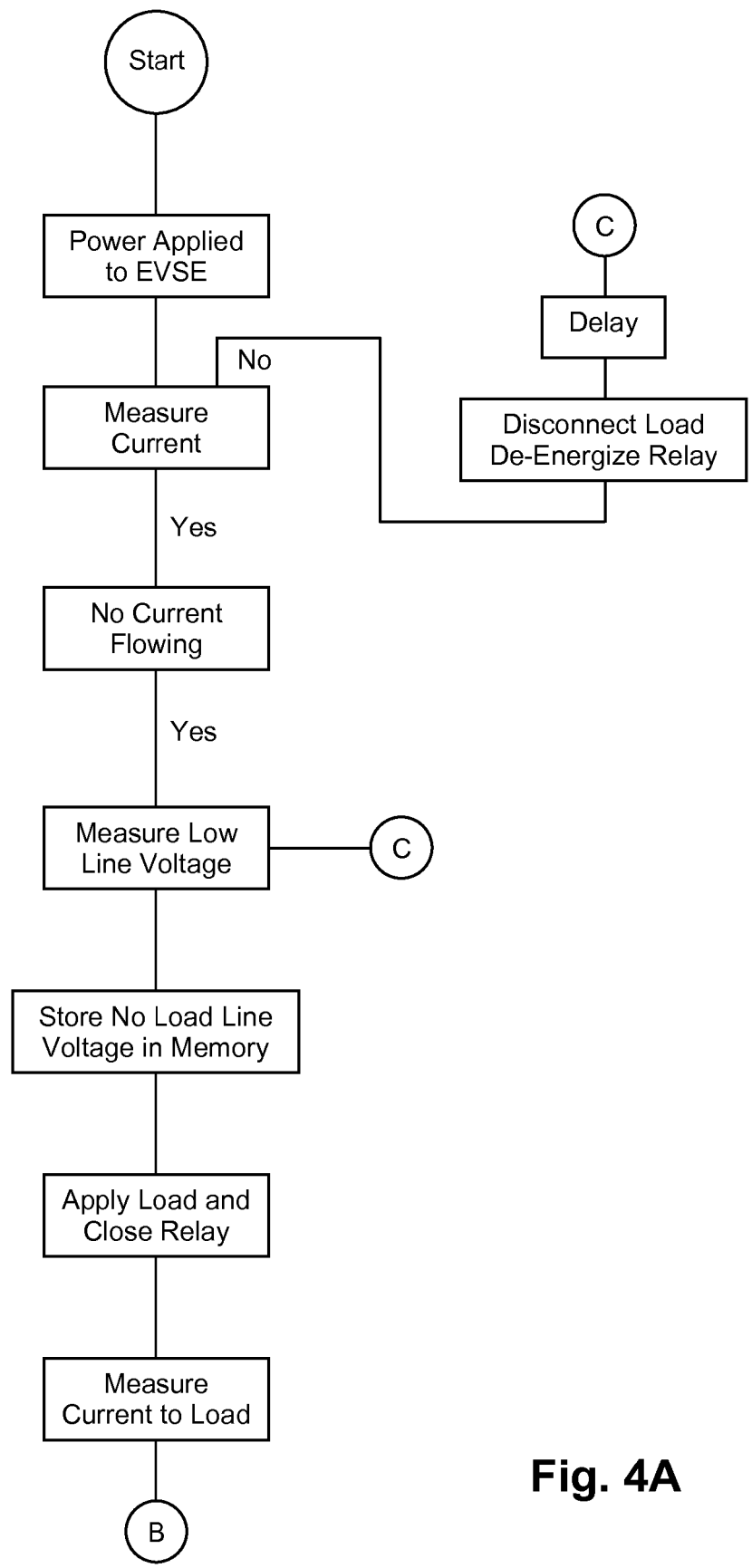
FIGS. 4A and 4B constitute a functional block diagram for the service line monitor of FIG. 2.
Figure 4B:
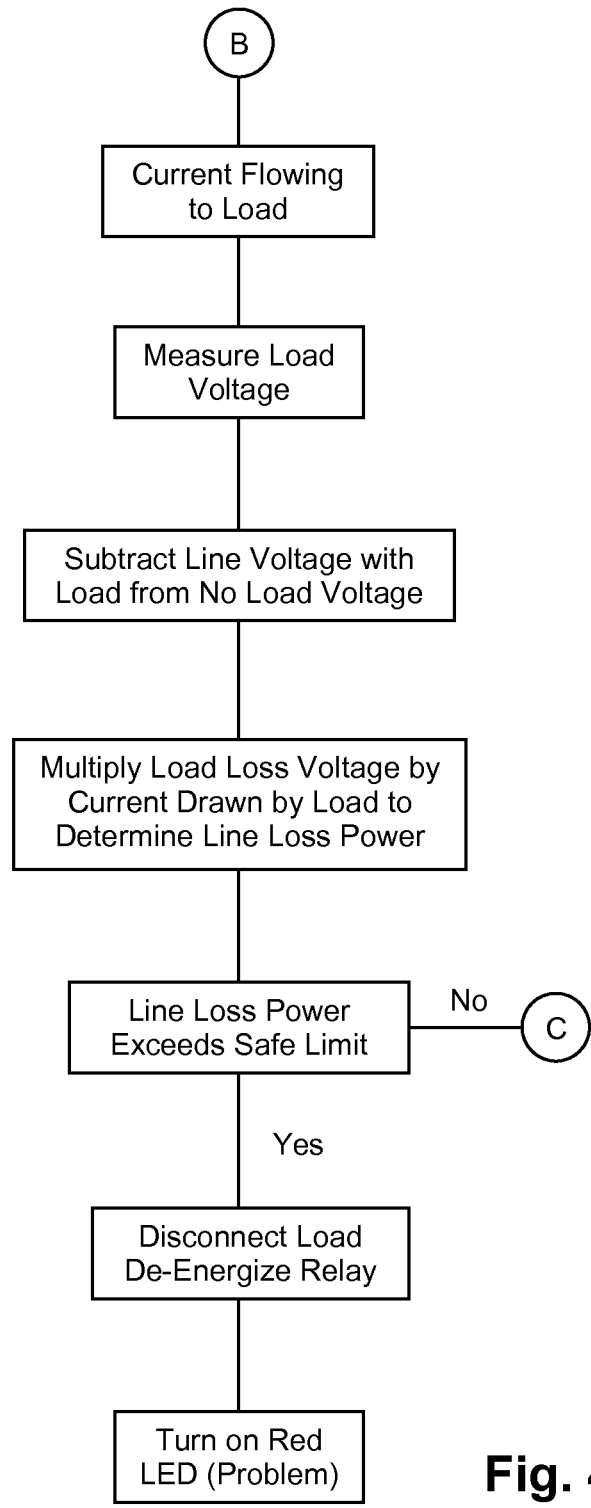

With reference to the idealized circuit of FIG. 3. The service line monitor is based on the reality that there is little or virtually no voltage drop caused by a loose component at a junction which is not connected to a load. Pursuant to Ohm's law, voltage V is equal to current I times the resistance R, e.g. V=IR. The power P is determined by P=VI and is commonly measured in watts.

When a voltage meter with a high resistance circuit $R_1$ is used to measure the voltage from the source, a small amount of current is required to for the circuit. A small amount of current flowing through a loose wire junction represented at resistor $R_2$ will cause a small percentage of the total source line voltage to develop across resistor $R_2$. When a switch $S_1$ is closed and a large load (low resistance) is applied to a circuit, the voltage drop $E_2$ across the loose junction $R_2$ will substantially increase the lowering of the voltage delivery to the representative load resistor $R_3$. This voltage differential equates directly to the amount of power being dissipated across the loose wire ($R_2$). In other words, the power is equal to the voltage across $R_2$ times the current flowing through $R_2$. The higher the current flowing in the circuit, the higher the voltage across the loose wire junction $R_2$ and thus the more power will be dissipated across the loose junction and the more elevated the surrounding temperature.

Although the service line monitor may be embodied in the form of a separate self-contained module 20 interposed between the power line 12 and the EVSE 14 and connected to an outlet 16 and the EVSE connector 18, as described herein, the description will be directed to the service line monitor 10 as incorporated into a portable EVSE.

Figure 1:
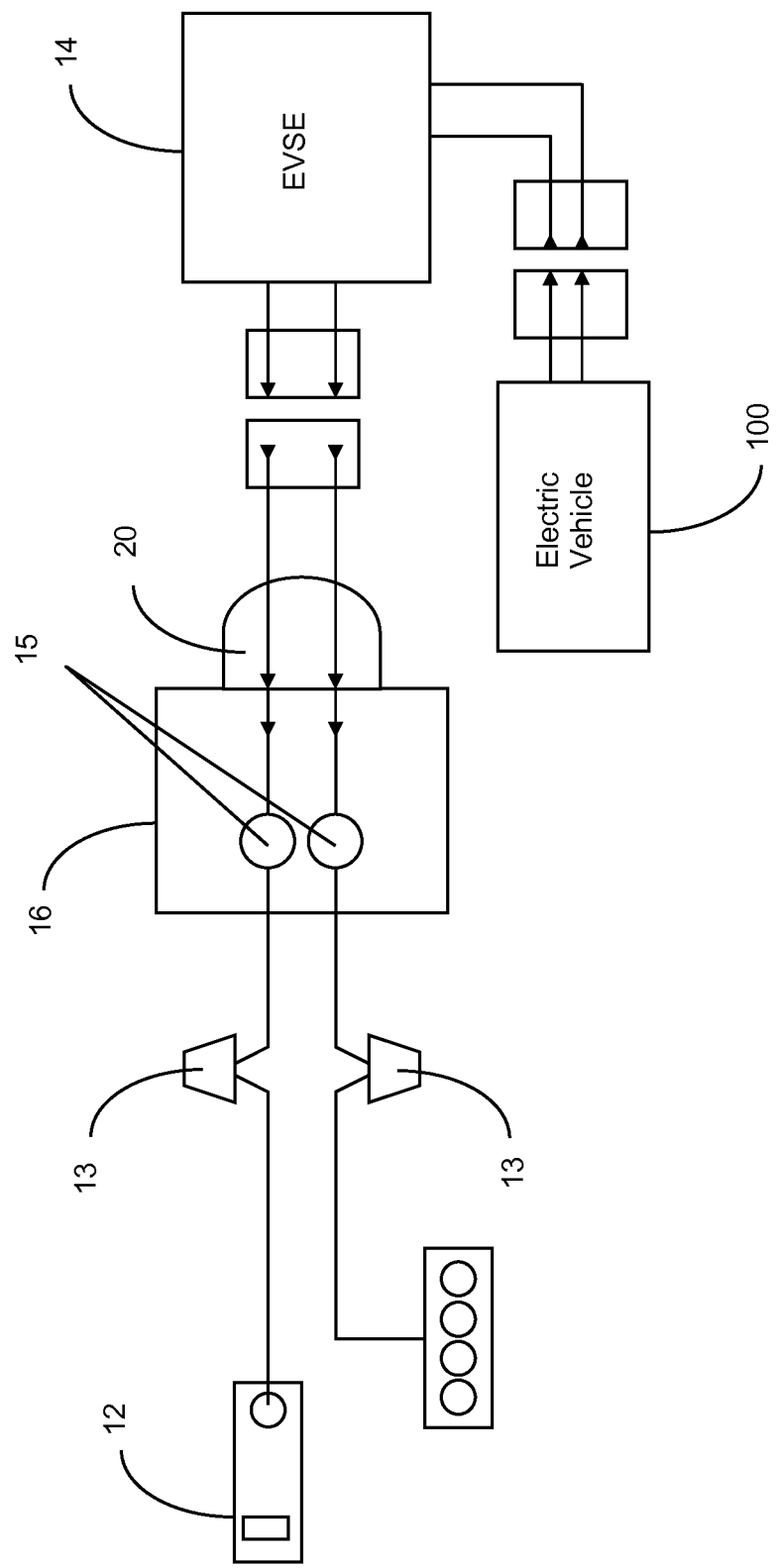
FIG. 1 is a schematic diagram of a representative service line monitor as connected with a portable EVSE connected to charge an electric vehicle.
Figure 2:
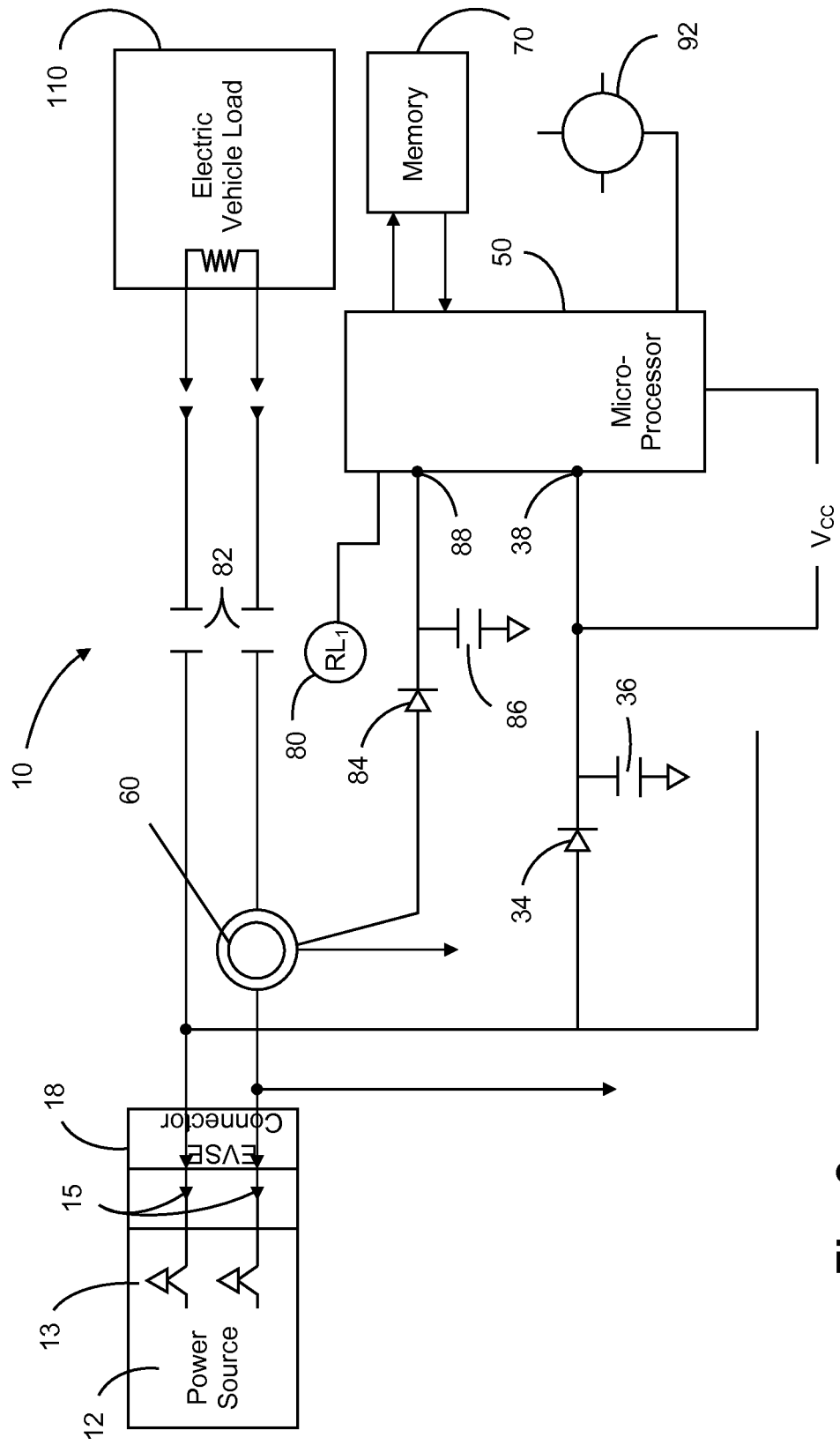
FIG. 2 is a schematic diagram of a circuit diagram illustrating a service line monitor integrated with an EVSE which is connected to a power line.

With reference to FIG. 2, when the line voltage is supplied to the EVSE connector 18, it is converted from AC to DC by the diode 34 and filtered by the capacitor 36. This DC voltage is applied to the microprocessor 50 at input port 38.

When initially activated, the microprocessor 50 first checks to see if current is flowing through current transformer 60. The transformer is indicative of the charging load. If no current is flowing, then the microprocessor 50 reads the line voltage derived from diode 34 and filter capacitor 36 and stores this no-load voltage in the memory 70.

The microprocessor 50 then activates relay 80 which closes contact 82, thereby supplying voltage to the electric vehicle 100 and its battery load 110. This also causes current to flow through the current transformer 60 which generates an AC voltage. The AC voltage is converted to a DC voltage by a diode 84 and filtered by a capacitor 86 and applied at input port 88 of the microprocessor 50.

The microprocessor 50 measures the current (DC voltage at port 88) and stores the load voltage value in the memory 70. The microprocessor measures the no load line voltage received at port 38 and subtracts the load voltage from the no line load voltage to determine the line voltage drop caused by connecting the load. The microprocessor 50 then multiplies the voltage drop and the load current to derive a power loss due to defects in the wire connection 13 and/or the plug connection 15.

When the power loss due to the connector exceeds a pre-established threshold, such as for example, 1%, the relay 80 is closed, opening the contact 82. The charging connection is terminated. A problem LED 92 is then illuminated to indicate a connection problem or a faulty outlet connection. Naturally, other threshold power loss values may be employed.

The line service monitor 10 will not reset unless the monitor (or circuit) is disconnected and re-connected.

The invention claimed is:

1. A method for detecting a defective connection to an EVSE comprising:
   applying line power to the EVSE;
   determining whether the EVSE is drawing a load current;
   measuring the line voltage when there is no-load current;
   storing the measured no-load line voltage in a memory;
   applying a current load to the EVSE;
   measuring the EVSE load voltage under a load;
   determining a voltage loss differential from the load voltage and the no-load voltage;
   deriving a power loss from the voltage loss differential;
   determining whether the power loss exceeds a safe limit; and
   disconnecting the EVSE load from line voltage if the safe limit is exceeded.

2. The method of claim 1 further comprising displaying a warning signal.

3. The method of claim 1 further comprising employing a current transformer to determine the load current.

4. The method of claim 1 wherein the step of disconnecting the EVSE load from line voltage further comprises employing a relay controlled line contact.

5. The method of claim 1 wherein the step of determining whether the power loss exceeds a safe limit further comprises storing safe limit data in a memory and comparing the power loss to said safe limit data.

6. A service line safety monitor comprising:
   a connector for applying line power to an EVSE;
   a current transformer for measuring the no-load line voltage when there is no-load current drawn by the EVSE;
   a memory for storing the measured no-load line voltage;
   means for measuring the EVSE load voltage when the EVSE is drawing a load current;
   a microprocessor programmed to determine the differential voltage between the no-load voltage and the load voltage measurements, the power loss due to the voltage differential and whether power loss exceeds a safe limit; and
   a line contact which is activatable to disconnect the EVSE from the line voltage if a safe limit has been exceeded.

7. The service line safety monitor of claim 6 wherein said line contact is controlled by a relay.

8. The service line safety monitor of claim 6 wherein said memory further stores safe limit data and said microprocessor accesses said safe limit data to determine whether power loss exceeds a safe limit.

9. The service line safety monitor of claim 6 wherein said monitor is configured as a module interposed between the service line and an EVSE.

10. The service line safety monitor of claim 6 wherein said monitor is integrated with said EVSE.

11. The service line safety monitor of claim 6 further comprising an indicator for displaying a warning signal when the safe limit is exceeded.

* * * * *